(12) United States Patent
Owen

(10) Patent No.: US 7,433,051 B2
(45) Date of Patent: Oct. 7, 2008

(54) DETERMINATION OF LITHOGRAPHY MISALIGNMENT BASED ON CURVATURE AND STRESS MAPPING DATA OF SUBSTRATES

(75) Inventor: David Owen, Redondo Beach, CA (US)

(73) Assignee: Ultratech, Inc., San Jose, CA (US)

( * ) Notice: Subject to any disclaimer, the term of this patent is extended or adjusted under 35 U.S.C. 154(b) by 35 days.

(21) Appl. No.: 11/716,440

(22) Filed: Mar. 9, 2007

(65) Prior Publication Data

US 2007/0212856 A1 Sep. 13, 2007

Related U.S. Application Data

(60) Provisional application No. 60/781,218, filed on Mar. 9, 2006.

(51) Int. Cl.
*G01B 11/02* (2006.01)
*G01L 1/24* (2006.01)

(52) U.S. Cl. ........................ 356/509; 356/511; 356/35.5

(58) Field of Classification Search ................ 356/35.5, 356/511–514, 489, 490, 495, 508, 509
See application file for complete search history.

(56) References Cited

U.S. PATENT DOCUMENTS

| 6,031,611 | A | * | 2/2000 | Rosakis et al. ............... 356/511 |
| 6,469,788 | B2 | | 10/2002 | Boyd et al. .................. 356/369 |
| 6,600,565 | B1 | * | 7/2003 | Suresh et al. ................ 356/521 |
| 6,781,702 | B2 | * | 8/2004 | Giannakopoulos et al. .. 356/601 |
| 6,924,497 | B2 | * | 8/2005 | Suresh et al. ............. 250/559.4 |
| 2004/0146792 | A1 | * | 7/2004 | Nimmakayala et al. ....... 430/22 |
| 2004/0218133 | A1 | * | 11/2004 | Park et al. .................... 349/153 |
| 2004/0257587 | A1 | * | 12/2004 | Rosakis et al. .............. 356/520 |
| 2005/0030551 | A1 | * | 2/2005 | Rosakis et al. .............. 356/521 |

* cited by examiner

*Primary Examiner*—Patrick J Connolly
(74) *Attorney, Agent, or Firm*—Allston L. Jones

(57) ABSTRACT

Provided are methods to be carried out prior to, while, and/or after performing a photolithographic process to a wafer that involve wafer misalignment assessment. The method involves obtaining curvature and/or deformation information of a surface of the wafer over a plurality of locations so as to obtain a curvature map of the wafer. The curvature map is processed to obtain a stress map of the wafer. The stress map is used to determine displacement of a layer of the wafer. The displacement information is used to determine a degree of misalignment in the photolithographic process.

31 Claims, No Drawings

DETERMINATION OF LITHOGRAPHY MISALIGNMENT BASED ON CURVATURE AND STRESS MAPPING DATA OF SUBSTRATES

CROSS-REFERENCE TO RELATED APPLICATIONS

This application claims priority to U.S. Provisional Patent Application Ser. No. 60/781,218, entitled "DETERMINATION OF LITHOGRAPHY MIS-ALIGNMENT BASED ON CURVATURE AND STRESS MAPPING DATA OF SUBSTRATES," inventor David Owen, filed on Mar. 9, 2006, the disclosure of which is incorporated by reference herein in its entirety.

BACKGROUND OF THE INVENTION

1. Field of the Invention

The invention relates generally to the metrological characterization and processing of substrates such as semiconductor wafers. In particular, the invention relates to methods and associated technologies that account and/or compensate for misalignment and overlay error issues associated with lithographic processing of semiconductor wafers.

2. Description of Background Art

Fabricating micro-electronic circuit and other microstructural features on a substrate typically involves the use of photolithographic technology. Such technology may include wafer processing that requires several photolithographic steps or stages to create the entire structure or circuit in layers or levels. Photolithography tools are often incorporated in production lines for carrying out a wafer process in successive stages. Each stage may be set up to carry out a subprocess of the wafer process. At least one subprocess may be a photolithographic process that requires use of a photolithography tool.

The effectiveness of photolithographic processes depends, often in part, on the alignment of a substrate under processing (or surface and/or interior features thereof) with respect to a mask used in the optical exposure of the photolithographic process. Misalignment of a substrate under processing with respect to the mask is undesirable and can occur due to various causes. For example, when misalignment exceeds the tolerance range, a resultant circuit may be rendered defective, thereby causing poor performance or even failure of the circuit.

In some instances, misalignment due to wafer warpage may lead to photolithography focus problems. Such focus problems are described in U.S. patent application Ser. No. 11/638,650, entitled "WAFER SCREENING AND WAFER PROCESSING CONTROL BASED ON MONITORING OF DEPTH OF FOCUS," filed Dec. 13, 2006, by inventor David Owen, assigned to Ultratech, Inc. This patent application also describes methods and production lines for carrying out a photolithographic process in which interferometry may be used to determine whether one or more locations on a wafer surface would or would likely to be out of focus in a photolithography tool associated with the photolithographic process.

In various lithographic systems, one or more alignment mechanisms are provided to align features with sufficient precision to overlay features in a given layer with respect to features in a prior level. In some implementations, direct measurements of the position of alignment marks or features may be used as part of the configuration or setup of a specific lithography process to optimize alignment or overlay of different layers with respect to one another. Such systems can be configured to compensate or modify the printing of features when the evaluation of alignment mark positions indicate that the actual position of the marks deviates from the nominal position. The required overlay precision scales with the size of the features being printed in some applications and the overlay precision may be on the order of 10 to 20 nanometers in some systems.

In addition, certain stages of production lines for wafer processing are more costly to setup, maintain and/or operate than others. For example, a particularly costly stage of a production line may employ a photolithography tool that requires a strict processing alignment tolerance and/or wafer quality. Loading of wafers of unacceptable quality or in an unacceptable manner into such a tool wastes tool operation time, increases the cost of the wafer process, and reduces the overall efficiency of the wafer process.

There are a number of ways in which quality control measures may be introduced in production lines that engage in wafer processing. For example, image-processing techniques may be used as a direct measurement of misalignment and overlay error. In general, such techniques are impractical because they are too time consuming. In addition, such techniques tend to emphasize magnitude over directionality and generally require the use of alignment marks or targets. By definition, alignment marks or targets are in the proximity of, but not at the exact location of devices. Accordingly, such techniques, while potentially suitable for localized measurements, lack wafer-scale or "global" accuracy. In short, known techniques are generally more microscale in nature and are not necessarily suitable for macroscale wafer evaluations.

Thus, there is a need to address such alignment issues in the context of photolithography. In particular, there is a need for technologies that allow for early, fast, accurate, robust, information-rich, and wholistic sorting of "good" wafers from "bad" in production lines that carry out wafer processes so as to improve line resource utilization.

SUMMARY OF THE INVENTION

The invention generally provides methods associated with photolithographic processing of wafers, e.g., semiconductor wafers. For example, a method is provided as an adjunct to be carried out prior to, while, and/or after performing a photolithographic process to a wafer. The method involves obtaining curvature information of a surface of the wafer over a plurality of locations so as to obtain a curvature map of the wafer. The curvature map is processed to obtain a stress map of the wafer. The stress map is used to determine displacement of a layer of the wafer. The displacement information is used to determine a degree of misalignment in the photolithographic process.

The curvature information may be obtained in any of a number of ways. For example, the curvature information may be obtained as a result from optical measurements made over the wafer surface. Exemplary optical measurement techniques include various types of interferometry such as full-field interferometry that simultaneously interrogates substantially the entire wafer surface and/or shearing interferometry. Optionally, curvature information may be substituted by more generalized information pertaining to mechanical deformation.

The wafer layer may be formed and or altered through any of techniques. In some instances, the layer is formed or altered via a deposition process. In addition or in the alternative, the layer may include a plurality of sublayers. In such as case, the stress map may be used to determine displacement of one or more selected sublayers of the wafer.

The stress map may be obtained through a number of different techniques as well. Exemplary techniques for stress map generation include, curvature change analysis and/or lattice strain analysis. In some instances, X-ray diffraction and/or Raman spectroscopy may be used to generate a stress map. Stress maps can also be generated through computation of driving forces from in-plane stress components, gradients thereof, and/or computation of interfacial shear stress from curvature change based on nonlocal analysis.

Various approaches may be used to determine layer displacement. For example, layer displacement determination may involve evaluating displacement of features patterned in the layer relative to a wafer structure of interest. In addition or in the alternative, one may evaluate the displacement of features in the layer on the wafer relative to a reference point associated with the photolithographic process. In any case, such evaluation may be used to ascertain whether the degree of misalignment in the photolithographic process falls within a misalignment tolerance budget.

In any case, the invention may be used to determine whether a photolithographic process to a wafer should be performed or continued. In some instances, for example, one may decide to perform or continue the photolithographic process only if the degree of misalignment would not lie outside a measure of tolerance for the photolithographic process. Such measures may involve a misalignment tolerance budget for the wafer or for the process. The misalignment determination may be carried out immediately before one decides to perform or continue the photolithographic process.

The photolithographic process may include a plurality of subprocesses. Such subprocesses may include, for example, wafer inspection, adding material to the wafer, and/or subtracting material from the wafer. In some instances, at least one subprocess involves altering at least one portion of the wafer such that the at least one portion of the altered wafer exhibits a characteristic measurably different from that of the wafer in a prealtered state. For example, the at least one portion may exhibit an altered electrical conductivity, an altered microstructure, or a phase change. In addition or in the alternative, the at least one portion may undergo annealing, alloying, ionic chemical reaction, and/or covalent chemical reaction.

Additional embodiments of the invention will be apparent to those of ordinary skill in the art upon examination of the art in view of the disclosure contained herein.

DETAILED DESCRIPTION OF THE INVENTION

Definitions and Overview

Before describing the present invention in detail, it is to be understood that this invention, unless otherwise noted, is not limited to specific substrates, temperature measuring means, or materials, all of which may vary. It is also to be understood that the terminology used herein is for the purpose of describing particular embodiments only, and is not intended to be limiting.

It must be noted that, as used in this specification and the appended claims, the singular forms "a," "an," and "the" include both singular and plural referents unless the context clearly dictates otherwise. Thus, for example, reference to "a location on a wafer" includes a plurality of locations as well as a single location, reference to "a layer" includes a laminate of layers as well as a single layer, and the like.

Furthermore, terminology indicative or suggestive of a particular spatial relationship between elements of the invention is to be construed in a relative sense rather an absolute sense unless the context of usage clearly dictates to the contrary. For example, the terms "over" and "on" as used to describe the spatial orientation of a second item relative to a first item does not necessarily indicate that the second item is located above the first item. Thus, in a device that includes a second layer placed over a first layer, the second layer may be located above, at the same level as, or below the first layer depending on the device's orientation. Similarly, an "upper" surface of a substrate may lie above, at the same level as, or below other portions of the substrate depending on the orientation of the substrate.

In describing and claiming the present invention, the following terminology will be used in accordance with the following definitions, unless the context in which they are employed clearly indicates otherwise.

The term "semiconductor" is used to refer to any of various solid substances having electrical conductivity greater than insulators but less than good conductors, and that may be used as a base material for computer chips and other electronic devices. Semiconductors be comprised substantially of a single element, e.g., silicon or germanium, or may be comprised of compounds such as silicon carbide, aluminum phosphide, gallium arsenide, and indium antimonide. Unless otherwise noted, the term "semiconductor" includes any one or a combination of elemental and compound semiconductors, as well as strained semiconductors, e.g., semiconductors under tension and/or compression. Exemplary indirect bandgap semiconductors suitable for use with the invention include Si, Ge, and SiC. Direct bandgap semiconductors suitable for use with the invention include, for example, GaAs, GaN, and InP.

The terms "substantial," and "substantially" are used in their ordinary sense and refer to matters that are considerable in importance, value, degree, amount, extent or the like. For example, the phrase "interrogates substantially the entire wafer surface" refers to a careful review or examination of a wafer surface. Such review or examination will typically involve checking the entirety or near the entirety of the wafer surface. Other uses of the term "substantially" involve an analogous definition.

The term "substrate" as used herein refers to any material having a surface, which is intended for processing, e.g., a supporting material on which a circuit may be formed or fabricated. The substrate may be constructed in any of a number of forms, for example, such as a semiconductor wafer containing an array of chips, etc., and may be of one or more nonsemiconductor materials as well as one or more semiconductor materials.

As a related matter, the term "wafer" as used herein refers generally to a thin slice of semiconductor used as a base material on which single transistors or integrated-circuit components are formed. The terms "wafer" and "substrate" are generally interchangeably used herein unless the context clearly indicates to the contrary.

In general, the invention relates to metrological and wafer-screening techniques that may be used to determine a degree of misalignment in a photolithographic process. For example, provided is a methodology for determining the potential and/or actuality for motion and/or displacement of a layer relative to a wafer for a photolithographic wafer process. More specifically, the methodology allows for such a motion and/or displacement determination with respect to previously processed underlying layers and features (lithographic misalignment) based on the distribution of stresses (forces) in a thin film system.

The invention is also based on the recognition that screening of wafers for misalignment prior to, during, or after a photolithographic process can improve the reliability of fabricated circuits or microstructures formed on the wafers during the photolithographic process. Such screening may additionally improve the efficiency the photolithographic process. In turn, the overall cost of a wafer process involving the photolithographic process may be reduced.

Thus, invention generally provides methods associated with photolithographic processing of substrates that involves obtaining curvature information of a surface of the wafer over a plurality of locations so as to obtain a curvature map of the substrate. The curvature map is processed to obtain a stress map of the substrate. The stress map is used to determine displacement of a layer of the wafer. The displacement information is used to determine a degree of misalignment in the photolithographic process. Typically, the curvature/stress maps are used to monitor and control potential for misalignment at a subsequent processing step, if any.

In some implementations, a specification for stress magnitude and uniformity (stress budgeting) can be developed and monitored against for process control. In other implementation, the misalignment information obtained from the curvature/stress map may be used to determine how to compensate or correct the operation of the lithographic system to minimize or optimize overlay across the wafer (lithographic system control using data that is fed forward).

Screening for Photolithography

As discussed above, a method is provided for carrying out misalignment screening for a photolithographic process. The method typically involves using a metrology system to obtain a curvature map of the wafer. The curvature map may then be processed to determine thin film (layer) stress map. The stress map may be used to make some assessments regarding the degree of misalignment for a specific step or subprocess or for a combination of steps or subprocesses. For example, stress measurement contained in the stress map may involve single films and single processes. In the alternative, the stress measurements may be taken for multiple films and multiple processes.

From stresses, displacement information (e.g., information relating to displacement, strain, mechanical driving forces, motion, etc.) may be determined. For example, lateral (in-plane) motion or displacement of a film may be determined relative to the stationary underlying film or feature. This may involve analysis of interfacial shear stress components in two orthogonal directions.

In some instances, an appropriate constitutive relationship may be used to compute absolute strain and displacement. In general, one needs to know the appropriate physical and mechanical properties of the constituent materials of the film or layer, as well as the geometry in order to compute displacements and strains from stress. Often in wafer processes, the nominal geometry is known. However, the relevant physical and mechanical properties are often unknown or poorly known because thin film properties may be quite different from the bulk properties. Thus, the usefulness of absolute strain and displacement calculations using constitutive model can be improved by reducing uncertainties in the physical and mechanical properties.

Nevertheless, stress measurements in the absence of a valid constitutive relationship are generally sufficient to evaluate the potential for misalignment on a relative basis (within a single wafer or comparing two wafers at the same stage of processing). Optionally, compensation parameters may be determined for control of lithography system to optimize overlay based on stress information (feed-forward approach).

From displacement information, one may determine a degree of misalignment in the photolithographic process. In some instances, misalignment may be correctable. In such a case, compensation parameters may be determined for control of lithography system to optimize overlay based on stress information (feed-forward approach). In the alternative, misalignment may not be correctable and lead to the accumulation of misalignment residuals, i.e., measured shift in the patterned features that that the lithographic system cannot compensate for (or eliminate through optimization). When excessive misalignment residuals accrue, misalignment potential may exceed a predetermined threshold for a particular process or series of processes.

Curvature Measurement

As discussed above, the invention typically involves measuring curvature information of a surface (patterned, unpatterned, front, back) of the wafer. Typically, the curvature information is obtained for the surface against which misalignment is measured, though curvature information of other surfaces may be used as well. In some instances, the measurement may be made as a part of a wafer process performed at a stage of a production line, e.g., a stage for performing a subprocess on patterned device wafers. In the alternative, the measurement may be performed offline.

While curvature information may be measured for varying number of surface locations, the invention is particularly useful when curvature information is measured for a large number of locations. For example, curvature information may be measured at 10, 50, 100, 1000, 10,000, 50,000 or more sites. In addition, overall wafer size may determine how curvature information is to be measured. For example, it may be desirable to make a greater number of measurements of topographic information for larger wafers than for smaller wafers. For a wafer having a diameter of 300 mm, wafer surface curvature may be mapped by measuring topographic information over 10,000 sites. Such mapping corresponds to an average site-to-site distance of approximately 3 mm.

In addition, the precise locale of the sites may vary as well. For example, the locations of the wafer from which curvature information is measured may be selected according to their relevance and/or materiality in misalignment to be measured. Thus, measurements may be made for clustered sites and/or uniformly distributed sites.

Field size of the photolithography tool or process associated with the invention represents a particularly useful and convenient reference point for curvature measurements. Field size is generally defined as the area of a wafer surface the photolithographic tool or process may simultaneously expose. While field size may vary by tool or process, exemplary field sizes for currently available photolithography tools and/or processes have a width of about 20 to 40 mm.

Any or a combination of techniques may be employed to carry such curvature measurements. For example, such techniques may involve one or more measurements relating to localized or wafer-scale slope (tilt) or curvature. In other words, such techniques may measure curvature directly or compute from other descriptions of the surface shapte as topography or slope.

Curvature measurements may involve differing measurement or metrological modes. In some instances, some measurement techniques may be carried out to interrogate simultaneously substantially the entire wafer surface. In other instances, different sections may be scanned in succession and obtained information may be "stitched together." As another option, sampling techniques may be used obtain curvature information on a statistically significant portion of the wafer surface, e.g., a portion of the wafer surface most prone to misalignment due to wafer warpage.

In any case, curvature measurements may result in a curvature map that describes the curvature of the wafer surface at a plurality of points. A complete description of the curvature at any point on the wafer surface typically involves three descriptors. In Cartesian space, for example, the three descriptors may include two direct curvatures ($d^2u/dx^2$ and $d^2u/dy^2$) and a twist curvature ($d^2u/dxdy=d^2u/dydx$). More detailed information typically yields a more complete mapping. Rudimentary mapping estimates may be made, however, with partial information, e.g., only the 'x' curvature ($d^2u/dx^2$).

Optical techniques may be used to measure curvature information of the wafer surface, optionally in real time or in an in situ monitoring context. For example, optical methods including Shack-Hartman sensor-based technologies or telecentric Schlieren techniques may be used. Interferometric methods known in the art such as Twyman-Green, Michelson and Mach-Zehnder techniques may also be used. In some instances, full-field shearing interferometry techniques, e.g., those involving coherent gradient sensing, may be used with the invention. Those of ordinary skill in the art will recognize that such methods will typically require an appropriate wafer illumination. Additional details relating to interferometry techniques suitable for use with the invention are described, e.g., in U.S. Patent Application Publication No. 2004/0257587 to Rosakis et al. and in U.S. Pat. Nos. 6,924,497, 6,781,702, 6,600,565, 6,469,788, and 6,031,611.

Non-optical techniques may be used with the invention as well. In some instances, an electrical method may be used. Electrical methods suitable for use with the invention may, for example, derive curvature data using capacitance measurements. In addition, mechanical means may also be used. For example, mechanical apparatuses such as profilometers employing a stylus may be used as well.

The curvature of the wafer can be evaluated using any wafer holder as long as curvature information is reliable. Wafer holders suitable for use with the invention may have varying configurations or geometries. Exemplary support configurations include those having on a three-pin support on which the wafer may rest as well as those in which a wafer is mounted vertically or horizontally. While curvature change techniques typically require a holder that allows a wafer to be held in a free-standing state, other techniques may be best practiced using a chuck configurations that renders a wafer nominally flat. For example, X-ray diffraction and Raman spectroscopy techniques may involve immobilizing a wafer in a chuck having a nominally flat chuck surface against which a wafer may be held with a controlled force, e.g., applied through electrostatic charge or vacuum.

Depending on the intended application of the invention, the invention may require measurement of the curvature of any substrate. For semiconductor processing applications, the invention typically employs an off-line metrology system capable of measuring the entire wafer surface (less than unpatterned edge exclusion zone) that is able to measure the surface characteristics of patterned and unpatterned wafers. As described in greater detail below, measurements may be conducted to determine the cumulative wafer misalignment for an entire photolithographic process or the incremental change in surface alignment caused by a specific subprocess.

Stress Map Production

The stress map may obtained by processing the curvature map through any of a number of techniques that allows individual stress components to be resolved. For example, stress measurement techniques based on curvature change (interferometry, line-scan) through the analysis of curvature measurements obtained in the practice of the invention. In some instances, additional data such as that associated with measurements of lattice strain (X-ray diffraction, Roman spectroscopy) may be used to supplement or replace information associated with the curvature map to come up with the stress map. Other techniques for measuring wafer deformation may involve profilometry and/or the use of a capacitance gauge.

In any case, it is often desirable to employ a metrology system that is capable of measuring the entire wafer surface (less the unpatterned edge exclusion zone) in order to obtain a stress map. As alluded to above, such systems may be able to measure the surface characteristics of patterned and unpatterned wafers. Measurements may be conducted to determine the cumulative thin film stress (across multiple films and processes) or the stress in a single, specific film, or the stress change induced by processes that does not necessarily involve film deposition (e.g. ion implant, rapid thermal annealing, etching).

In order to determine the actual or potential displacement or motion of a layer relative to a wafer, it is helpful to calculate the mechanical driving forces associated with such displacement or motion. In general, the potential for relative displacement or sliding of a layer (in which a feature is being fabricated) with respect to another previously fabricated feature (assumed stationary) results from a mechanical driving force. To satisfy equilibrium conditions, gradients of in-plane stresses in a thin film structure on a substrate may be balanced by an interfacial shear stress (interface between film and substrate) or relaxed by motion of the film system relative to the substrate. Depending on the specific information obtained, different approaches may be implemented to compute the driving force (both in magnitude and direction).

A finite element analysis approach may be used to determine the stresses associated with wafer layer displacement. In some instances, driving forces may be computed from in-plane film stress components. Assuming that x and y axes are in-plane and the z axis is orthogonal to both x and y axes, in-plane equilibrium (no net force) may be described by the following equations:

$$F_x = Q_x dA = (\delta\sigma_{xx}/\delta x + \delta\sigma_{xy}/\delta y) h_f dl = 0 \qquad \text{eq.1}$$

$$F_y = Q_y dA = (\delta\sigma_{xy}/\delta x + \delta\sigma_{yy}/\delta y) h_f dl = 0 \qquad \text{eq.2}$$

where $h_f$ is the film thickness, A is the area of the film cross section, $\sigma$ is stress, F is force, and Q is resultant stress gradient.

Equilibrium analysis reveals that the gradient of stresses across a finite volume of thin film structure can be used to compute the net force. The apparent net force may be balanced by interfacial shear stresses as follows:

$$F_{net} = F_{in} = (F_x^2 + F_y^2)^{0.5} \qquad \text{eq.3}$$

where $F_{net}$ is net force computed from in-plane stress gradients, and $F_{in}$ is force acting along the interface between two layers. As a result, the in-plane direction of the net force is computed from the ratio of the force components in the x and y directions as follows:

$$\theta = \tan^{-1}(F_y/F_x) \qquad \text{eq.4}$$

where θ is direction of net force (θ=0 along the x-axis).

Interfacial shear stress may also be computed from curvature change based on non-local analysis. For example, the following equation describes interfacial shear stress based on gradients of curvature change components:

$$\tau = \frac{E_s h_s^2}{6(1-v_s^2)} \frac{d(K_{rr} + K_{\theta\theta})}{dr} \qquad \text{eq. 5}$$

where τ is the interfacial sheer stress, $E_s$ and $v_s$ are the Young's modulus and Poisson's ratio of the substrate, respectively, $h_s$ is the substrate thickness, and $K_{rr}$ and $K_{\theta\theta}$ are the radial and circumferential curvature change components, respectively.

This data may be represented in different forces, for example as a map of displacement magnitudes or a vector map at specific locations of interest on the wafer that illustrates both magnitude and direction.

Determination of Strains and Displacement

The relationship between stresses and strains (forces and displacements) for a system is often referred to as a constitutive relation. In thin film structures, the constitutive relation will depend on the geometry of the structure and the constituent materials and their relevant physical and mechanical properties. As discussed above, localized physical and mechanical material properties of such localized features on a wafer surface may be unknown. Accordingly, thin film structures with complicated constructions (e.g., including multiple materials and spatially varying geometries or having undergone numerous processes and thermal cycles) may be difficult to model in any complete or comprehensive manner from first principles. In practice, however, the constitutive relation may be derived analytically for simple geometries and material behavior. For more complex systems, numerical modeling or empirical study (or a combination of multiple approaches) may be required to develop an appropriate constitutive relationship for the system of interest.

In any case, the constitutive relationship serves to relate stress and force information through an appropriate equation, relationship, model or other framework to determine the displacement or potential for displacement (both magnitude and direction) at a device structure of interest. In the absence of a direct computation of displacement from stress, the stress information provides a measure of the relative potential for misalignment when comparisons are made between different regions on the wafer or different wafers having nominally identical structures or at the same point in processing and fabrication. In contrast, the knowledge of the constitutive behavior of the structure allows the overlay/misalignment potential to be evaluated on an absolute basis, facilitating comparisons of misalignment potential across different processes and structures.

The data may be represented in different forms. For example, a vector map may be provided that shows the displacement magnitudes and directionality at specific locations of interest on the wafer. In addition or in the alternative, the data may be provided in tabular or other form that provided for facile human and computer manipulation.

In some instances, it may be possible to calibrate, correlate an/or develop a lookup table for a specific structure. For example, one could compare the values obtained using equations 1 and 2 to some other technique that measures displacement directly (e.g. positional measurement of alignment marks). In short, the invention may serve as a cross check against existing quality control methods to ensure no critical misalignment issues are overlooked.

Misalignment Determination

Once displacement information of a wafer layer is obtained, the information may be used to determine whether any misalignment has taken place. Such misalignment analysis may dictate whether the photolithographic process should take place or continue. In some instances, the process may proceed if no more than a percentage of locations on the wafer surface has experienced an unacceptable degree of misalignment. For example, certain photolithography or wafer processes require that no more than 10% of interrogated locations on a wafer surface have undergone an unacceptable degree of misalignment. A more stringent process may require that no more than about 5% or 1% of interrogated locations be unacceptably misaligned.

In some instance, the positions of misaligned locations may be a more important consideration than the total number of misaligned locations. For example, a unitary wafer may contain an array of dies, which may be separated from each other at an end of a wafer process. The wafer process may allow for numerous misaligned locations as long as the locations are all located on a small faction of the dies, e.g., less than about 50%, 25%, 10% or 5% of the total number of dies.

In any case, it should be noted that the invention has been reduced to practice through a number of experiments set forth in U.S. Provisional Patent Application Ser. No. 60/781,218.

Photolithographic Process Control

Turning to lithography process control for a wafer as a whole, there is typically specified an overlay "budget" value for specific structures. In practice, the overlay may be evaluated using test structures that include or consist of alignment marks of patterns. Using the output from stress and/or displacement characterizations, the potential for misalignment or overlay errors can be evaluated against a predetermined process control limit. A monitoring strategy can be implemented after any process step associated with the fabrication of a structure since the stress evolution can be characterized for any process step. In this manner the total overlay "budget" can be allocated or partitioned to individual process steps thereby enabling a finer level of control (process step-by-process step instead of cumulative) in advanced microelectronic circuit fabrication.

Immediately prior to a photolithographic process involving exposure, for example, compensation parameters may be determined in order to optimize and/or minimize misalignment based on information from available metrology. The information derived from stress/force evaluation may be used as a basis for further optimization of the lithographic system control so as to minimize overlay errors.

The alignment-adequacy determination may indicate whether a wafer is to be placed or processed in a photolithography tool. In some instances, a wafer may be placed in the tool for photolithography processing immediately after the alignment-adequacy determination is made. However, the photolithographic tool may carry out a photolithography processes as a subprocess of a larger overall wafer process. Thus, before the wafer is placed in the photolithographic tool, another subprocess of the wafer process may be performed.

Exemplary subprocesses of the wafer process may involve inspecting the wafer, adding material to and/or removing material from the wafer, and altering at least one portion of the wafer such that the at least one portion of the altered wafer exhibits a characteristic measurably different from that of the wafer in a prealtered state. An altered wafer may, for example, exhibit an altered electrical conductivity, an altered microstructure. Such alteration may be effected through annealing or other techniques. In some instances, at least one portion of the wafer may exhibit a phase change, alloying, ionic chemical reaction, and/or covalent chemical reaction.

In short, the invention provides a way to account or budget for misalignment in photolithographic processes and production lines. Given a series of process steps, specifications for the incoming/initial wafer misalignment and specifications for each subsequent process can be developed and monitored as part of process control. Both the cumulative and incremental misalignment information can be measured and evaluated against process control specifications.

Thus, the invention provides a number of advantages previously unknown in the art. In particular, persons of ordinary skill in the art will find that the value of the invention derives from a number of process efficiencies. For example, the invention allows a practitioner of a photolithographic process a way to evaluate whether it would be a waste of time to perform or continue the process on specific wafers by sorting out wafers which cannot be exposed correctly to result in an acceptable yield. In addition, the invention allows the practitioner to catch process excursions that may directly affect misalignment when they occur and not several process steps down the line. Such efficiencies may result in a direct dollar savings amount that may be computed based on cycle time for a series or processes between measurement point and lithography, wafer starts and value of wafers at risk.

Variations of the present invention will be apparent to those of ordinary skill in the art in view of the disclosure contained herein. For example, the curvature map of the substrate may be implemented in various measuring systems. A suitable system for measuring the curvature map may be an offline system, an inline system, or a system that is integrated in to a process chamber/tool. For example, a full field optical wafer measuring system may be used. Various optical full-filed wafer measuring systems suitable for implementing the above prephotolithography wafer screening and processing control are described in U.S. Patent Application Publication No. 2004/0257587 to Rosakis et al.

In addition, while the invention has been described primarily as a multistep process that converts curvature information into a misalignment determination, raw data obtained as a part of the multistep process may be used in other contexts as well. For example, raw misalignment data may be useful in the context of deciding whether or not a wafer is 'good' or 'bad' at some point/process upstream of lithography.

As another variation, it should be noted that strain measurements may replace or supplement curvature measurements. For example, X-ray diffraction and Raman spectroscopy can be used to measure lattice strain. In turn, the lattice strain may be used similarly to infer the potential for misalignment. Furthermore, an X-ray diffraction approach may be used to measure lattice rotation that, in turn, can be used to compute curvature (from slope inferred from the lattice rotation).

It is to be understood that, while the invention has been described in conjunction with the preferred specific embodiments thereof, the foregoing description merely illustrates and does not limit the scope of the invention. Numerous alternatives and equivalents exist which do not depart from the invention set forth above. For example, any particular embodiment of the invention may be modified to include or exclude features of other embodiments. Other aspects, advantages, and modifications within the scope of the invention will be apparent to those skilled in the art to which the invention pertains.

All patents, and patent applications mentioned herein are hereby incorporated by reference in their entireties to the extent not inconsistent with the description set forth above.

What is claimed is:

1. A method, comprising, prior to, while, and/or after performing a photolithographic process to a wafer:
   (a) measuring curvature information of a surface of the wafer over a plurality of locations so as to obtain a curvature map of the wafer;
   (b) processing the curvature map to obtain a stress map of the wafer;
   (c) using the stress map to determine displacement information for a layer of the wafer; and
   (d) using the displacement information to determine a degree of misalignment in the photolithographic process.

2. The method of claim 1, wherein step (a) is carried out optically.

3. The method of claim 1, wherein step (a) is carried out through interferometry.

4. The method of claim 3, wherein step (a) is carried out through full-field interferometry that simultaneously interrogates substantially the entire wafer surface.

5. The method of claim 4, wherein step (a) is carried out using shearing interferometry.

6. The method of claim 1, further comprising, before step (a), processing the wafer so as to form and/or alter the layer on the wafer surface.

7. The method of claim 6, wherein the layer is formed via a deposition process.

8. The method of claim 1, wherein the layer comprises a plurality of sublayers, and step (d) is carried out for a sublayer selected from the layer.

9. The method of claim 1, wherein step (b) involves curvature change analysis.

10. The method of claim 1, wherein step (b) involves lattice strain analysis.

11. The method of claim 9, wherein step (b) involves X-ray diffraction and/or Raman spectroscopy.

12. The method of claim 1, wherein step (b) involves computation of driving forces from gradients of in-plane stress components.

13. The method of claim 1, wherein step (b) involves computation of interfacial shear stress from curvature change based on nonlocal analysis.

14. The method of claim 1, wherein step (c) involves determining displacement information for the layer relative to a wafer structure of interest.

15. The method of claim 1, wherein step (c) involves determining displacement information for the layer on the wafer relative to a reference point associated with the photolithographic process.

16. The method of claim 1, wherein step (d) is carried out in a manner effective to determine whether the degree of misalignment in the photolithographic process falls within a misalignment tolerance budget.

17. The method of claim 16, further comprising:
   (e) performing or continuing the photolithographic process to the wafer only if step (d) reveals that the degree of misalignment falls within a misalignment tolerance budget for the wafer.

18. The method of claim 16, further comprising:
   (e) performing or continuing the photolithographic process to the wafer only if step (d) reveals that the degree of misalignment falls within a misalignment tolerance budget for the photolithographic process.

19. A method, comprising, prior to and/or while performing a photolithographic process to a wafer:
- (a) measuring curvature information of a surface of the wafer over a plurality of locations so as to obtain a curvature map of the wafer;
- (b) processing the curvature map to obtain a stress map of the wafer;
- (c) using the stress map to determine to determine displacement information for a layer on the wafer;
- (d) using the displacement information to determine a degree of misalignment in the photolithographic process; and
- (e) performing or continuing the photolithographic process to the wafer only if step (d) reveals that the degree of misalignment would not lie outside a measure of tolerance for the photolithographic process.

20. The method of claim 19, wherein step (e) occurs immediately after step (d).

21. The method of claim 19, wherein the photolithographic process includes a plurality of subprocesses.

22. The method of claim 21, wherein at least one subprocess involves inspecting the wafer.

23. The method of claim 21, wherein at least one subprocess involves adding material to and/or removing material from the wafer.

24. The method of claim 21, wherein at least one subprocess involves altering at least one portion of the wafer such that the at least one portion of the altered wafer exhibits a characteristic measurably different from that of the wafer in an prealtered state.

25. The method of claim 24, wherein the at least one portion exhibits an altered electrical conductivity.

26. The method of claim 24, wherein the at least one portion exhibits an altered microstructure.

27. The method of claim 24, wherein the at least one portion of the wafer is annealed.

28. The method of claim 24, wherein the at least one portion of the wafer exhibits a phase change, alloying, ionic chemical reaction, and/or covalent chemical reaction.

29. A method, comprising, prior to, while, and/or after performing a photolithographic process to a wafer:
- (a) measuring deformation information of a surface of the wafer over a plurality of locations;
- (b) processing the deformation information to obtain a stress and/or strain map of the wafer;
- (c) using the stress and/or strain map to determine displacement information for a layer of the wafer; and
- (d) using the displacement information to determine a degree of misalignment in the photolithographic process.

30. The method of claim 29, wherein step (a) involves measuring curvature change.

31. The method of claim 30, wherein step (a) involves measuring lattice strain.

* * * * *